(12) United States Patent
Nedachi

(10) Patent No.: US 10,499,545 B2
(45) Date of Patent: Dec. 3, 2019

(54) STACKED MODULE, STACKING METHOD, COOLING/FEEDING MECHANISM, AND STACKED MODULE MOUNTING BOARD

(71) Applicant: NEC CORPORATION, Tokyo (JP)

(72) Inventor: Takaaki Nedachi, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/892,712

(22) Filed: Feb. 9, 2018

(65) Prior Publication Data

US 2018/0270992 A1 Sep. 20, 2018

(30) Foreign Application Priority Data

Mar. 15, 2017 (JP) .................. 2017-049683

(51) Int. Cl.
*H05K 7/20* (2006.01)
*H05K 1/14* (2006.01)
(Continued)

(52) U.S. Cl.
CPC ........... *H05K 7/20509* (2013.01); *G06F 1/20* (2013.01); *H05K 1/0203* (2013.01); *H05K 1/144* (2013.01); *H05K 1/181* (2013.01); *H05K 3/368* (2013.01); *H05K 7/1417* (2013.01); *H05K 2201/042* (2013.01); *H05K 2201/10159* (2013.01);
(Continued)

(58) Field of Classification Search
CPC .. H05K 7/20509; H05K 1/0203; H05K 1/144; H05K 1/181; H05K 3/368; H05K 7/1417; H05K 2201/042; H05K 2201/10159; H05K 2201/10189; H05K 2201/10378; H05K 2201/10545; H05K 2201/10734
See application file for complete search history.

(56) References Cited

U.S. PATENT DOCUMENTS 5,040,052 A * 8/1991 McDavid ............ H01L 23/5385
257/E23.172
5,343,358 A * 8/1994 Hilbrink ................ H05K 7/208
165/104.33
(Continued)

FOREIGN PATENT DOCUMENTS

JP 06-090072 A 3/1994
JP 2006093659 A 4/2006
(Continued)

OTHER PUBLICATIONS

Communication dated Mar. 6, 2018 from the Japanese Patent Office in counterpart Japanese application No. 2017-049683.

*Primary Examiner* — James Wu
*Assistant Examiner* — Michael A Matey
(74) *Attorney, Agent, or Firm* — Sughrue Mion, PLLC

(57) ABSTRACT

A stacked module includes stacked multiple boards having components mounted thereon, a connection component electrically connecting the stacked boards, and a feeding/cooling mechanism configured to feed the boards and to cool the components mounted on the boards. The feeding/cooling mechanism includes a cooling member that is inserted between the stacked, electrically connected boards and that is in contact with and cools the components mounted on the boards and a feeding member that is in contact with and feeds the boards.

12 Claims, 7 Drawing Sheets

(51) Int. Cl.
*H05K 7/14* (2006.01)
*H05K 3/36* (2006.01)
*H05K 1/18* (2006.01)
*H05K 1/02* (2006.01)
*G06F 1/20* (2006.01)

(52) U.S. Cl.
CPC .............. *H05K 2201/10189* (2013.01); *H05K 2201/10378* (2013.01); *H05K 2201/10545* (2013.01); *H05K 2201/10734* (2013.01)

(56) References Cited

U.S. PATENT DOCUMENTS

| | | | | |
|---|---|---|---|---|
| 6,469,671 | B1* | 10/2002 | Pluymers | G01S 7/032 343/700 MS |
| 6,829,574 | B1* | 12/2004 | Ito | G06F 17/5027 703/15 |
| 7,068,515 | B2* | 6/2006 | Harris | H05K 7/1092 165/80.3 |
| 9,357,649 | B2* | 5/2016 | Chun | H05K 1/117 |
| 9,437,943 | B1* | 9/2016 | Davis | H05K 3/368 |
| 9,827,629 | B2* | 11/2017 | Kinsley | G01R 31/048 |
| 2002/0053726 | A1* | 5/2002 | Mikubo | H01L 23/36 257/685 |
| 2004/0057211 | A1* | 3/2004 | Kondo | G06F 1/20 361/696 |
| 2005/0073817 | A1* | 4/2005 | Barsun | H05K 3/301 361/760 |
| 2006/0043585 | A1* | 3/2006 | Sukegawa | H01L 23/48 257/737 |
| 2006/0109623 | A1* | 5/2006 | Harris | G06F 1/184 361/690 |
| 2006/0133041 | A1* | 6/2006 | Belady | G06F 1/20 361/704 |
| 2006/0181857 | A1* | 8/2006 | Belady | H01L 23/467 361/719 |
| 2008/0225476 | A1* | 9/2008 | Karabatsos | G06F 1/185 361/679.32 |
| 2009/0180257 | A1* | 7/2009 | Park | H01L 23/64 361/709 |
| 2012/0230700 | A1* | 9/2012 | Cafiero | G02B 6/4201 398/138 |
| 2013/0321239 | A1* | 12/2013 | Bingham | H01Q 1/24 343/879 |
| 2014/0017912 | A1* | 1/2014 | Ha | H01R 12/73 439/74 |
| 2015/0085903 | A1* | 3/2015 | Gundel | H05K 1/0239 375/219 |
| 2015/0138732 | A1* | 5/2015 | Okumura | H01L 25/18 361/716 |
| 2015/0342053 | A1* | 11/2015 | Savic | H01L 23/24 361/761 |
| 2017/0264052 | A1* | 9/2017 | Henry | H01R 13/518 |

FOREIGN PATENT DOCUMENTS

| | | |
|---|---|---|
| JP | 2006-202975 A | 8/2006 |
| JP | 2014212284 A | 11/2014 |

\* cited by examiner

5

6

STACKED MODULE, STACKING METHOD, COOLING/FEEDING MECHANISM, AND STACKED MODULE MOUNTING BOARD

INCORPORATION BY REFERENCE

The present invention is based upon and claims the benefit of priority from Japanese patent application No. 2017-049683, filed on Mar. 15, 2017, the disclosure of which is incorporated herein in its entirety by reference.

TECHNICAL FIELD

The present invention relates to a stacked module, stacking method, feeding/cooling mechanism, and stacked module mounting board and, in particular, to a stacked module, stacking method, feeding/cooling mechanism, and stacked module mounting board that are able to suppress a voltage drop.

BACKGROUND ART

Semiconductor devices such as memories, various components, boards, and the like may be stacked in order to achieve a speedup or capacity increase.

Examples of technologies that perform such stacking is Patent Document 1. Patent Document 1 discloses an electronic apparatus including stacked multiple double-sided mounting circuit board units, connectors that electrically connect the double-sided mounting circuit board units, and cooling structures. Specifically, the connectors are disposed such that at least one edges of the stacked double-sided mounting circuit board units are opened. The connectors electrically connect the double-sided mounting circuit board units at edges of the double-sided mounting circuit board units. The cooling structures are disposed between mutually opposed semiconductor devices in the stack structure and are in contact with the mutually opposed semiconductor devices. According to Patent Document 1, the above configuration allows for efficient heat dissipation while maintaining high-density mounting of the semiconductor devices.

Examples of the related art include Patent Document 2. Patent Document 2 discloses a technology that connects multiple motherboards arranged in parallel in the direction of a normal to the motherboards using a vertical connection board and a vertical short-circuit board, as well as performs power supply to the motherboards and physical fixing of the motherboards using four power supply/fixing spacers disposed between the motherboards.

Patent Document 1: Japanese Unexamined Patent Application Publication No. 2006-202975
Patent Document 2: Japanese Unexamined Patent Application Publication No. 6-90072

SUMMARY OF THE INVENTION

Stacking semiconductor devices such as memories, components, boards, and the like for a speedup or capacity increase causes an increase in power supply current and thus an increase in voltage drop. Use of silicon interposer boards or the like results in a reduction in conductor thickness, making a voltage drop more likely to occur. As seen above, stacking semiconductor devices such as memories for a speedup or capacity increase causes a voltage drop problem.

The technology of Patent Document 1 has difficulty in addressing such a voltage drop problem, since power supply and signal transmission are performed using pins formed in the same connector and the number or the like of the pins used to supply power is difficult to increase. Moreover, the power supply and signal transmission using the same connector are more likely to densely pack signals or the like in the boards or the like. This also makes it difficult to address a voltage drop. As seen above, the technology of Patent Document 1 has difficulty in addressing a voltage drop.

While the technology of Patent Document 2 stacks the motherboards having memories, CPU, and the like mounted thereon, it is not a technology that stacks one type of elements, such as the memories, included in the motherboards. Also, the technology of Patent Document 2 requires the multiple spacers, as well as the vertical connection board and vertical short-circuit board, causing a problem that it prevents downsizing.

As seen above, mounting of semiconductor devices or the like by stacking has difficulty in addressing a voltage drop without upsizing.

Accordingly, an object of the present invention is to provide a stacked module, stacking method, feeding/cooling mechanism, and stacked module mounting board that solve the problem that mounting of semiconductor devices or the like by stacking has difficulty in addressing a voltage drop without upsizing.

To achieve the object, a stacked module of one aspect of the present invention includes:

stacked multiple boards having components mounted thereon;

a connection component electrically connecting the stacked boards; and a feeding/cooling mechanism configured to feed the boards and to cool the components mounted on the boards.

A stacking method of another aspect of the present invention includes:

electrically connecting stacked multiple boards having components mounted thereon, using a connection component; and inserting a feeding/cooling mechanism between the stacked boards, the feeding/cooling mechanism being configured to feed the boards and to cool the components mounted on the boards.

A cooling/feeding mechanism of another aspect of the present invention includes:

a cooling member that is inserted between stacked, electrically connected boards and that is in contact with and cools the components mounted on the boards; and a feeding member that is in contact with and feeds the boards.

A stacked module mounting board of another aspect of the present invention includes a stacked module and an arithmetic device that performs a predetermined process. The stacked module includes stacked multiple boards having components mounted thereon, a connection component electrically connecting adjacent boards of the stacked boards, and a feeding/cooling mechanism that feeds the boards and cools the components mounted on the boards.

According to the above configurations, the present invention is able to provide a stacked module, stacking method, feeding/cooling mechanism, and stacked module mounting board that solve the problem that mounting of semiconductor devices or the like by stacking has difficulty in addressing a voltage drop without upsizing.

EXEMPLARY EMBODIMENT

First Embodiment

Figure 1:
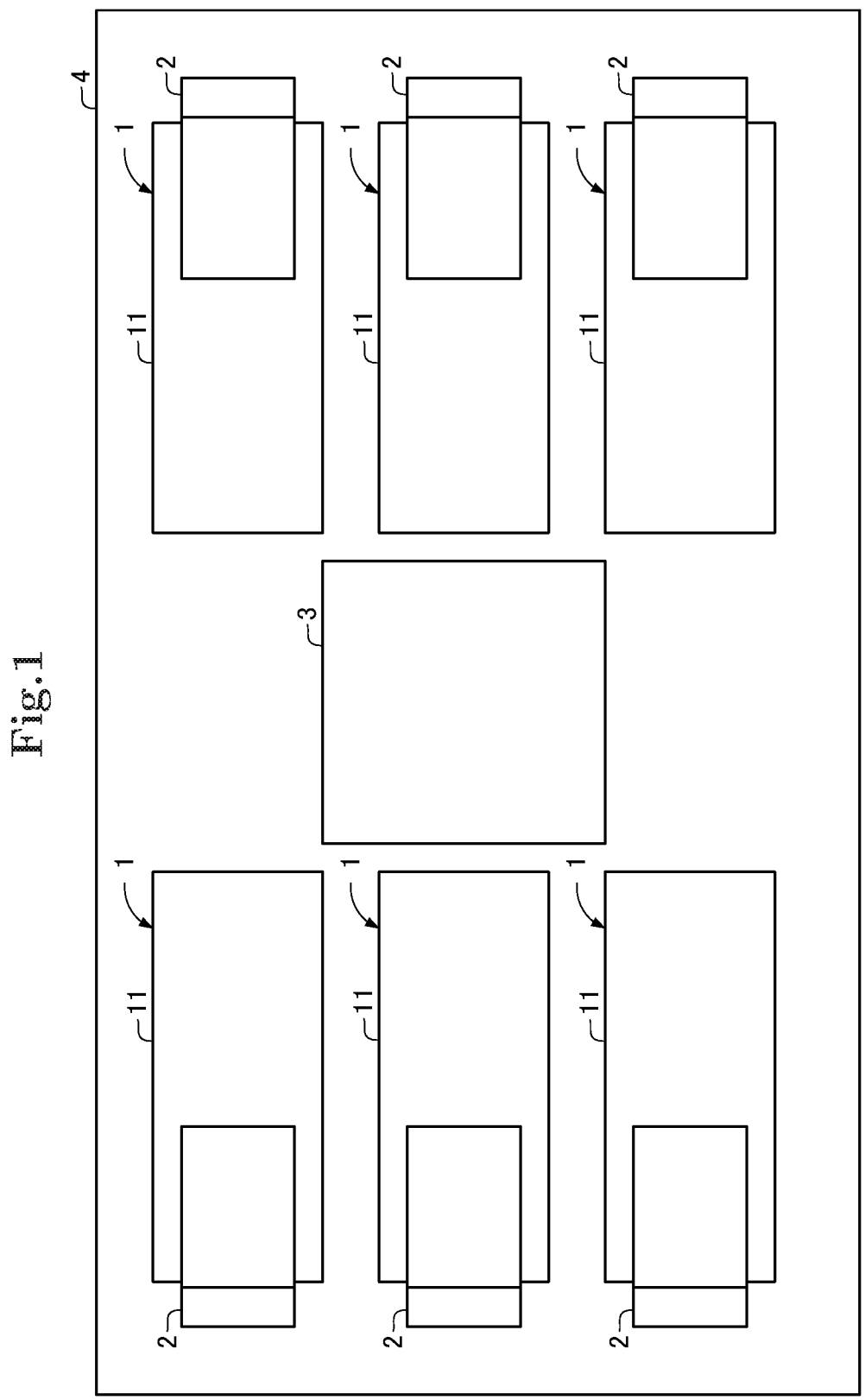
FIG. 1 is a plan view showing an example of the configuration of a board having thereon a stacked memory module according to a first embodiment of the present invention.
Figure 2:
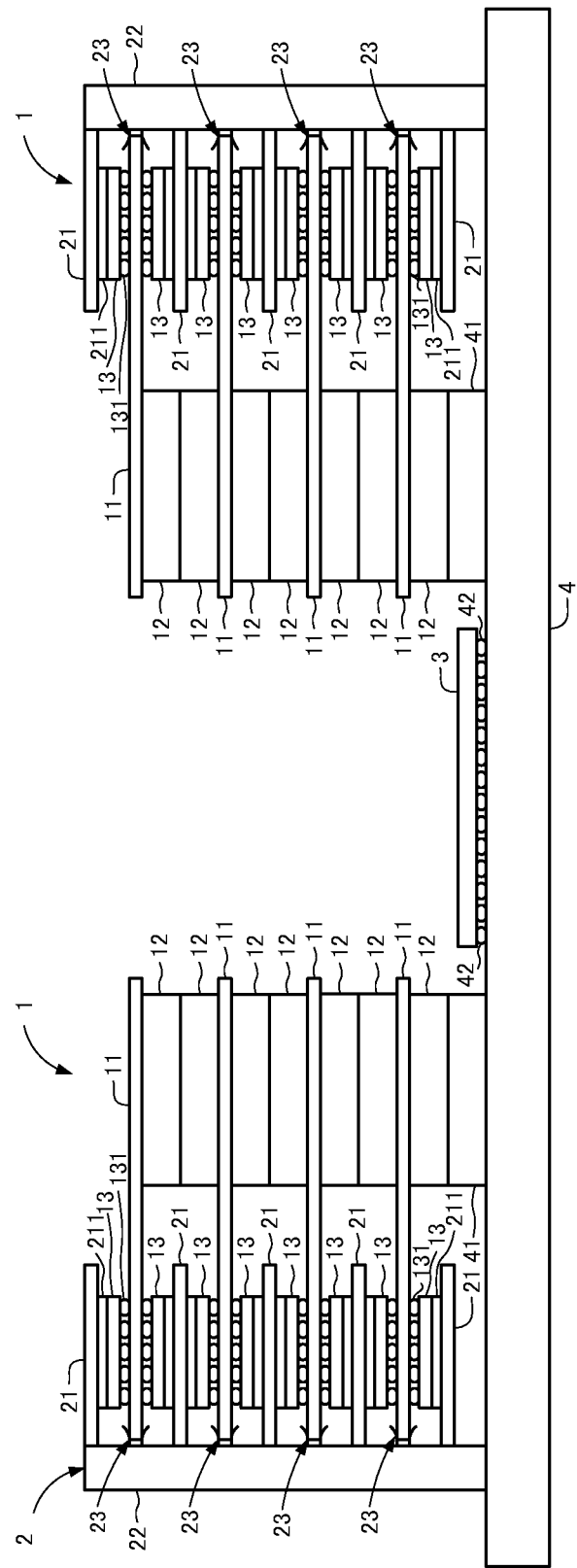
FIG. 2 is a front view showing an example of the configuration of the board shown in FIG. 1.
Figure 3:
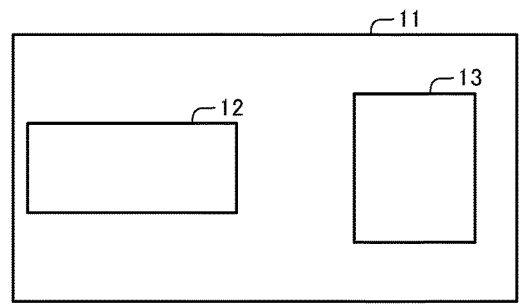
FIG. 3 is a plan view showing an example of the configuration of an interposer board included in the stacked memory module shown in FIG. 1 and elements on the interposer board.
Figure 4:
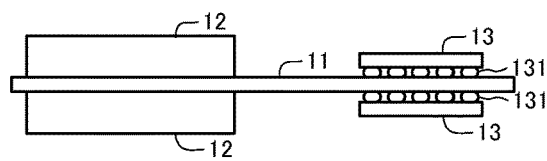
FIG. 4 is a front view showing an example of the configuration of the interposer board and the elements on the interposer board shown in FIG. 3.
Figure 5:
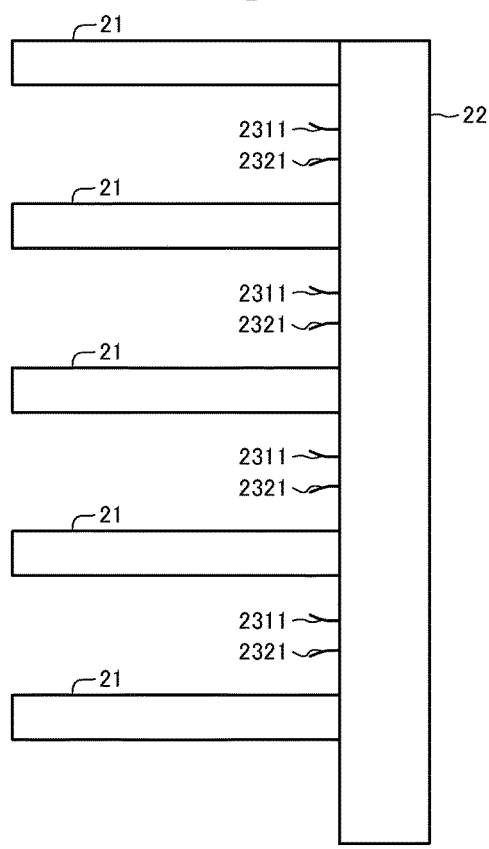
FIG. 5 is a front view showing an example of the configuration of a feeding/cooling mechanism shown in FIG. 1.
Figure 6:
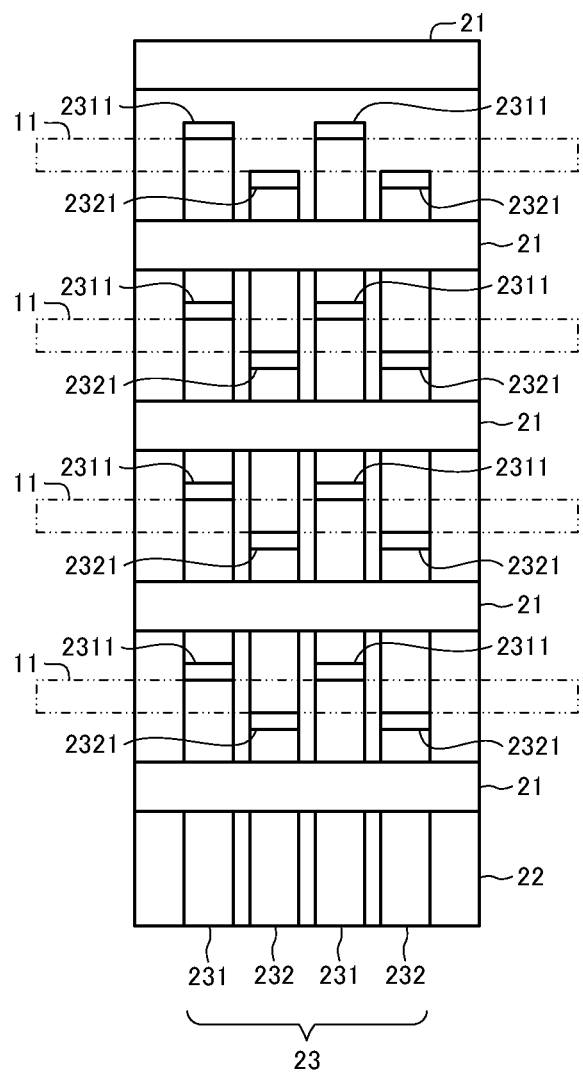
FIG. 6 is a left side view showing an example of the configuration of the feeding/cooling mechanism shown in FIG. 5.
Figure 7:
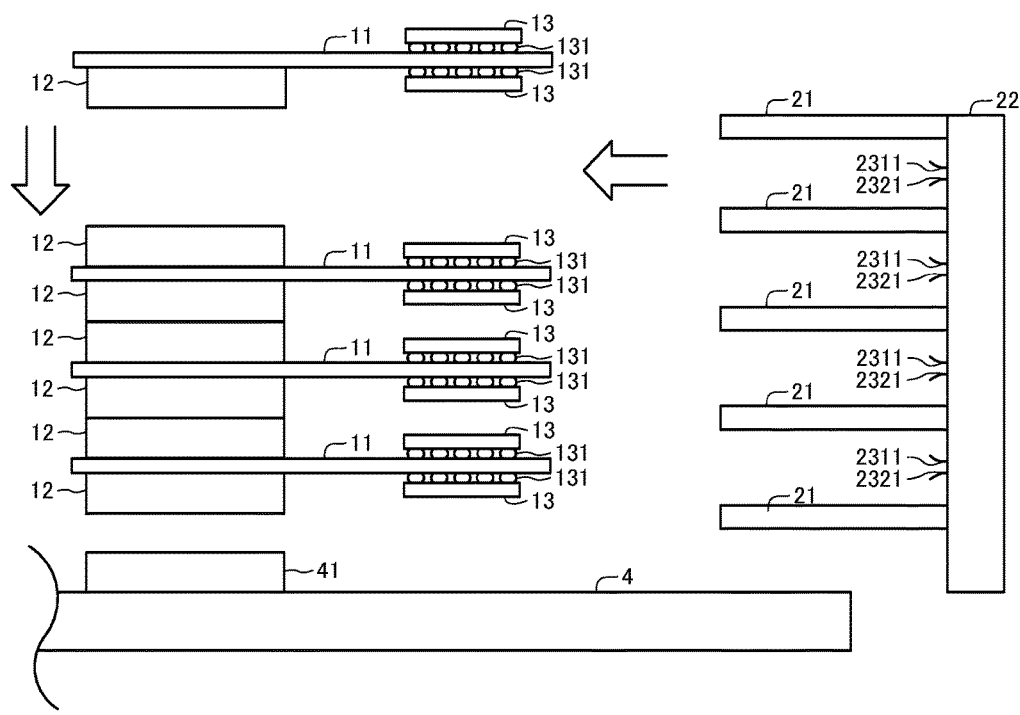
FIG. 7 is a drawing showing an example of the flow of a process of mounting the stacked memory module on the board.
Figure 8:
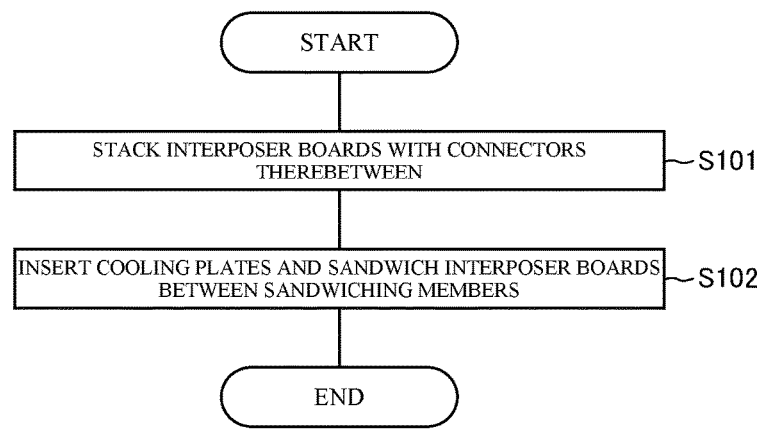
FIG. 8 is a flowchart showing an example of the flow of a process of producing the stacked memory module.
Figure 9:
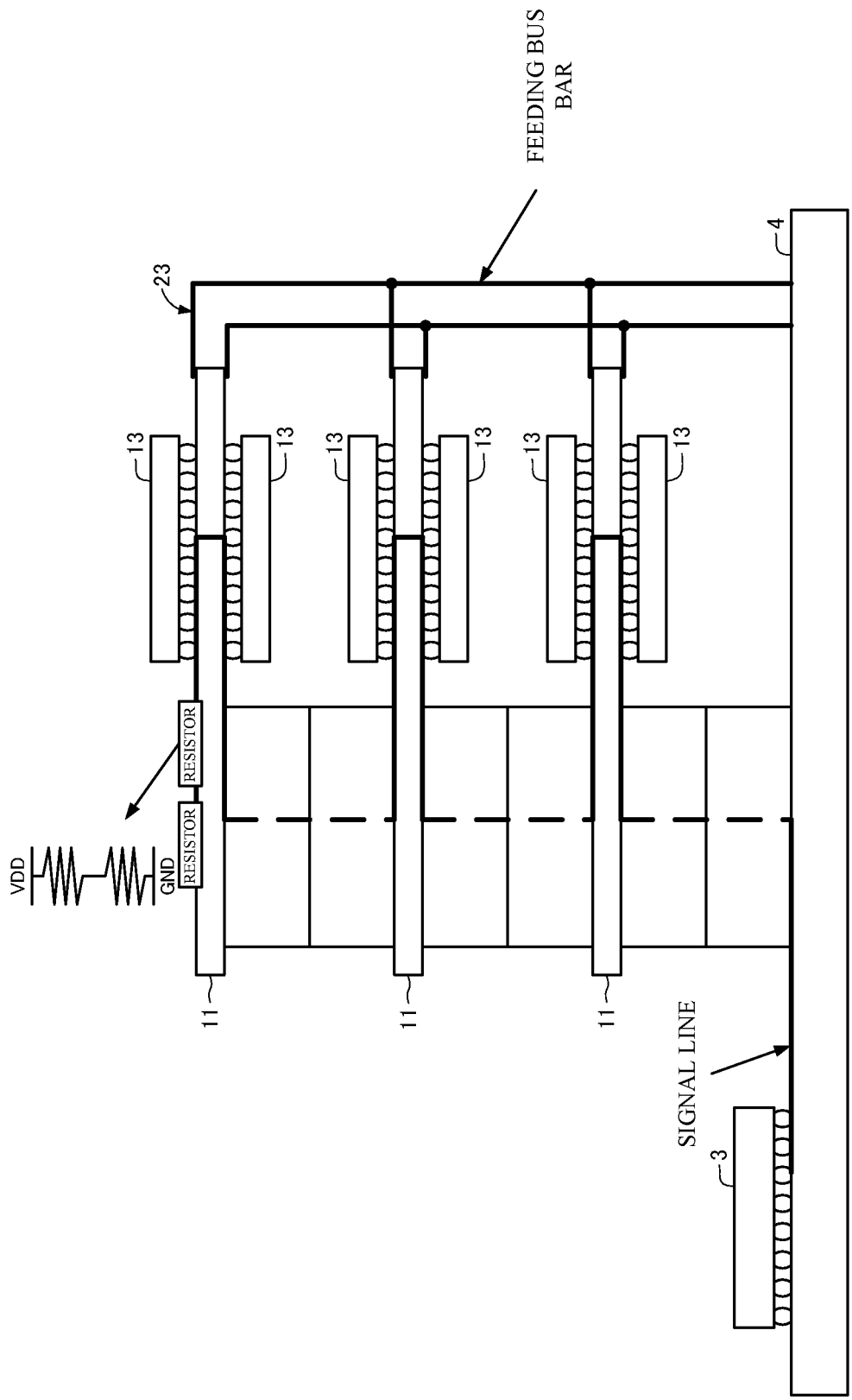
FIG. 9 is a drawing showing the flow of a signal and power in the stacked memory module according to the first embodiment.

A first embodiment of the present invention will be described with reference to FIGS. 1 to 8. FIG. 1 is a plan view showing an example of the overall configuration of a board 4 having stacked memory modules 1 mounted thereon. FIG. 2 is a front view showing an example of the overall configuration of the board 4. FIG. 3 is a plan view showing an example of an interposer board 11 and elements on the interposer board 11 (elements of a memory module). FIG. 4 is a front view showing an example of the interposer board 11 and the elements on the interposer board 11 (elements of a memory module). FIG. 5 is a front view showing an example of the configuration of a feeding/cooling mechanism 2. FIG. 6 is a left side view showing an example of the configuration of the feeding/cooling mechanism 2. FIG. 7 is a drawing showing an example of the flow of a process of mounting the stacked memory module 1 (interposer boards 11 and feeding/cooling mechanism 2) on the board 4. FIG. 8 is a flowchart showing an example of the flow of a process of producing the stacked memory module 1. FIG. 9 is a drawing showing the flow of a signal and power in the stacked memory module 1.

The stacked memory module 1 (stacked module) according to the first embodiment includes interposer boards 11 (memory modules) stacked using stacked connectors 12, and a feeding/cooling mechanism 2. As will be described later, the feeding/cooling mechanism 2 includes feeding members 23 (feeding bus bars 231, 232) that feed the stacked interposer boards 11, and cools memories 13 and feeds the interposer boards 11. The stacked memory module 1 of the present embodiment thus configured allows for the transmission of a main signal to the memories 13 on the interposer boards 11 through the connectors 12, as well as allows for the supply of power (power supply voltage, ground voltage) to the interposer substrates 11 through the feeding members 23 of the feeding/cooling mechanism 2. In other words, the stacked memory module 1 thus configured is able to independently use the signal transmission channels to the memories 13 and the power supply channels to the memories 13.

In the present embodiment, the term "upper" refers to the direction toward the side having a CPU (central processing unit) 3 and stacked memory modules 1 mounted thereon, of the board 4 in FIG. 2, and the term "lower" refers to the direction toward the side having no elements mounted thereon, of the board 4 in FIG. 2. Note that while FIG. 2 shows an example in which the CPU 3 and stacked memory modules 1 are mounted on the upper side of the board 4, the CPU 3 and stacked memory modules 1 may be mounted on the lower side of the board 4.

Referring now to FIGS. 1 and 2, the stacked memory modules 1 according to the present embodiment are mounted around the CPU 3 (arithmetic device) that performs a predetermined process, on the board 4 that is approximately rectangular in plan view. By stacking the memories 13 around the CPU 3, a high-speed, large-capacity memory can be achieved.

More specifically, as shown in FIG. 2, the CPU 3 is mounted in the center (the position may be other than the center) of the board 4 using bumps 42. Prior to mounting the CPU 3, connectors 41 for electrically connecting the board 4 and interposer boards 11 are mounted around a CPU 3 mounting position on the board 4. The stacked memory modules 1 are mounted around the CPU 3 by connecting the connectors 41 disposed on the board 4 and the connectors 12 of the stacked memory modules 1 (interposer boards 11) and fastening the feeding/cooling mechanism 2 to the board 4 using screws or the like.

In the example shown in FIG. 1, six stacked memory modules 1 are mounted around the CPU 3. More specifically, three stacked memory modules 1 are mounted on each of the left and right sides of the CPU 3. However, the number of stacked memory modules 1 mounted around the CPU 3 (that is, mounted on the board 4) is not limited to six and may be, for example, two or three or more. Similarly, the number of connectors 41 disposed on the board 4 may be any number.

Each stacked memory module 1 includes stacked memory modules and a feeding/cooling mechanism 2. Each memory module includes an interposer board 11 (board), connectors 12 (connection component) disposed on the interposer board 11, and memories 13 (components) mounted on the interposer board 11.

The interposer board 11 is, for example, a silicon interposer board (may be of any type other than a silicon interposer board). As shown in FIGS. 2 to 4, an interposer board 11 according to the present embodiment is a double-sided mounting plate board that is approximately rectangular in plan view, and memories 13 (components) are mounted on both sides thereof using bumps 131. That is, the memories 13 are mounted on the upper and lower sides of the interposer board 11. Connectors 12 are disposed on the upper and lower sides (at least one side) of the interposer board 11.

The connectors 12 are disposed near one short side of the approximately rectangular interposer board 11, and the memories 13 are mounted near the other short side thereof. Formed on the edge near the memories 13, of the interposer board 11 (in positions on the right side of a memory 13 in FIG. 3) are electric pads (not shown) for receiving power supply from the corresponding feeding member 23 of the feeding/cooling mechanism 2 (to be discussed later). As will be described later, sandwiching members 2311, 2321 of the feeding member 23 are in contact with the electric pads on the interposer board 11 and thus the interposer board 11 receives power supply from the feeding member 23.

While, in FIG. 4, memories 13 are mounted on the interposer board 11 so as to be vertically symmetrical with respect to the interposer board 11, the memories 13 need not necessarily be mounted in such a manner and may be mounted only on one of the upper and lower sides of the interposer board 11.

While, in FIG. 4, connectors 12 are disposed on the upper and lower sides of the interposer board 11, a connector 12 may be disposed only on one of the upper and lower sides of the interposer board 11. For example, an interposer board 11 having a connector 12 disposed only on the lower side thereof may be used as an interposer board 11 located in the highest position in the stacked memory module 1. A predetermined resistor or the like may be formed on the side having no connector 12 disposed thereon, of the interposer board 11.

The connectors 12 electrically connect the interposer board 11 to other interposer boards 11 stacked on the interposer substrate 11. The connectors 12 are also connected to the connector 41 disposed on the board 4. A main signal or the like is transmitted to the memories 13 on the interposer board 11 through the connectors 12. Note that the memories 13 on the interposer board 11 may receive auxiliary power through the connectors 12 [or may receive power only from the feeding/cooling mechanism 2 (to be discussed later)].

The memories 13 are DDR (double-data-rate) memories, HBM (High Bandwidth Memory) memories, HMC (Hybrid Memory Cube) memories, or the like. However, the memories 13 may be of any type other than those described above. The memories 13 are mounted on the interposer board 11 with the bumps 131 therebetween.

A thermal compound 211 such as thermal grease may be applied to the memories 13. As will be described later, the memories 13 are in contact with cooling plates 21 of the feeding/cooling mechanism 2 through the thermal compound 211 (or the memories 13 may be in direct contact with the cooling plates 21). In other words, the thermal compound 211 may be applied to the upper surface of the memory 13 mounted on the upper side of the interposer board 11 and the lower surface of the memory 13 mounted on the lower side of the interposer board 11. Thus, the memories 13 are in contact with the cooling plates 21 through the applied thermal compound 211. The thermal compound 211 allows heat generated by the memories 13 to efficiently escape into the cooling plates 21.

In the present embodiment, the memory modules thus configured are stacked. While FIG. 2 shows an example in which four memory modules are stacked on each of the left and right sides of the CPU 3, any number of memory modules may be stacked. That is, a stacked memory module 1 may consist of two stacked memory modules, or may consist of three or more stacked memory modules.

The feeding/cooling mechanism 2 feeds the interposer boards 11, as well as cools the memories 13 mounted on the interposer boards 11. The feeding/cooling mechanism 2 includes a cooling member that mainly cools the interposer boards 11 and the feeding members 23 that mainly feed the interposer boards 11. As shown in FIG. 2, the feeding/cooling mechanism 2 is inserted between the stacked memory modules from the sides opposite to the sides having the connectors 12 disposed thereon, of the approximately rectangular interposer boards 11.

The cooling member is in contact with the memories 13 through the thermal compound 211 and allows heat generated by the memories 13 to escape to the outside. The cooling member includes the cooling plates 21 and a cooling support 22. The cooling plates 21 and cooling support 22 forming the cooling member are formed of a material having high thermal conductivity, such as copper or aluminum.

Referring to FIGS. 5 and 6, the cooling plates 21 are plate members that are approximately rectangular in plan view, and are formed on the cooling support 22. The cooling plates 21 are formed above the upper sides or below the lower sides of the stacked interposer boards 11 so as to be in contact with the memories 13 mounted on the interposer boards 11 from above or below. For example, as shown in FIG. 2, a cooling plate 21 located in the highest position of the cooling member is in contact with a memory 13 mounted on the upper side of the highest interposer board 11 through the thermal compound 211 from above. A cooling plate 21 located in an intermediate position of the cooling member is inserted between stacked two interposer boards 11 and is in contact with a memory 13 mounted on the lower side of the upper interposer board 11 and a memory 13 mounted on the upper side of the lower interposer board 11 through the thermal compound 211. A cooling plates 21 located in the lowest position of the cooling member is in contact with a memory 13 mounted on the lower side of the lowest interposer board 11 through the thermal compound 211 from below. As seen above, the cooling plates 21 are formed on the cooling support 22 so as to be in contact with the memories 13 mounted on the interposer boards 11. The cooling plates 21 cool the memories 13 mounted on the interposer boards 11 through the thermal compound 211.

The cooling support 22 is, for example, approximately quadrangular prism-shaped and has the multiple cooling plates 21 formed on one surface thereof. The cooling support 22 has, for example, vertically extending recesses in the surface thereof on which the cooling plates 21 are formed, and the feeding members 23 (feeding bus bars 231 and feeding bus bars 232) are inserted in the recesses.

While the five cooling plates 21 are formed on the cooling support 22 in FIGS. 2, 5, and 6, the number of cooling plates 21 may be changed in accordance with the number of memory modules stacked. In other words, one of feeding/cooling mechanisms 2 where different numbers of cooling plates 21 are formed may be selectively used in accordance with the number of memory modules (interposer boards 11) stacked.

The feeding members 23 are in contact with the electric pads formed on the interposer boards 11 and feed (supply a power supply voltage or ground voltage to) the interposer boards 11. Each feeding member 23 includes a feeding bus bar 231 that supplies a power supply voltage (VDD) to a corresponding interposer board 11 and a feeding bus bar 232 that supplies a ground (GND) voltage to the interposer board 11. The feeding members 23 (i.e., feeding bus bars 231 and feeding bus bars 232) are formed of, for example, a material having low electrical resistance, such as copper. By forming the feeding members 23 of a material such as copper, a function of cooling the memories 13 by cooling the interposer boards 11 can be provided to the feeding members 23.

Referring to FIGS. 5 and 6, the feeding bus bars 231 and feeding bus bars 232 are, for example, approximately quadrangular prism-shaped members. The feeding bus bars 231 and feeding bus bars 232 are inserted in the recesses formed in the cooling support 22. Each feeding bus bar 231 supplies a power supply voltage to an interposer board 11 in contact with the feeding bus bar 231 through sandwiching members 2311 thereof. Each feeding bus bar 232 supplies a ground voltage to a corresponding interposer board 11 through sandwiching members 2321 thereof.

The sandwiching members 2311 and sandwiching members 2321 are formed in positions corresponding to the stacked interposer boards 11. The sandwiching members 2311 and sandwiching members 2321 include spring mechanisms, and the interposer boards 11 are sandwiched therebetween from above and below. As shown in FIG. 6, the sandwiching members 2311 are located on the upper sides of the interposer boards 11, and the sandwiching members 2321 are located on the lower sides of the interposer boards 11. The interposer boards 11 are inserted between the sandwiching members 2311 and sandwiching members 2321, as well as sandwiched between the sandwiching members 2311 and sandwiching members 2321 from above and below. In other words, the interposer boards 11 are sandwiched between the sandwiching members 2311 located above the interposer boards 11 and the sandwiching members 2321 located below the interposer boards 11. As described above, the sandwiching members 2311 and sandwiching members 2321 are in contact with the interposer boards 11 through the electric pads formed on the interposer boards 11. Accordingly, the feeding bus bars 231 and feeding bus bars 232 feed the interposer boards 11 through the sandwiching members 2311 and sandwiching members 2321, and the electric pads.

In the example shown in FIG. 6, each feeding member 23 includes two feeding bus bars 231 and two feeding bus bars 232. However, the numbers of feeding bus bars 231 and feeding bus bars 232 forming each feeding member 23 are not limited to those numbers. For example, each feeding member 23 may include one feeding bus bar 231 and one feeding bus bar 232, or may include three or more feeding bus bars 231 and three or more feeding bus bars 232.

The thicknesses of the feeding bus bars 231 and feeding bus bars 232 can be adjusted. By adjusting the thicknesses of the feeding bus bars 231 and feeding bus bars 232, the amount of current that can be passed can be adjusted.

The memory modules and feeding/cooling mechanism 2 forming the stacked memory module 1 are configured as described above. Next, an example of the flow of a process of mounting the stacked memory modules 1 on the board 4 will be described with reference to FIGS. 7 and 8.

Referring to FIGS. 7 and 8, the interposer boards 11 are stacked with the connectors 12 therebetween (step S101). Specifically, the interposer boards 11 are stacked by connecting the connectors 12 mounted on the interposer boards 11 to each other. Thus, the memory modules are stacked.

Then, the thermal compound 211 is applied to the memories 13, and the cooling plates 21 are mounted on the upper sides or lower sides of the stacked interposer boards 11 or inserted therebetween. Also, the interposer boards 11 are sandwiched between the sandwiching members 2311 and sandwiching members 2321 (step S102). Thus, the stacked memory module 1 consisting of the stacked memory modules and feeding/cooling mechanism 2 is formed.

Then, the connector 12 of the lowest interposer board 11 is connected to the connector 41 mounted on the board 4. The cooling support 22 is fastened to the board 4 using screws or the like, and the feeding bus bars 231 and feeding bus bars 232 are fastened to the board 4 using screws, soldering, or the like. Thus, the stacked memory module 1 is mounted on the board 4, as shown in FIG. 2.

The interposer boards 11 may be stacked after connecting a connector 12 on the lower side of an interposer board 11 to the connector 41 mounted on the board 4. That is, an interposer board 11 may be electrically connected to the board 4 before or after step S101.

FIG. 9 is a drawing showing the flow of a signal and power in the stacked memory module 1. Referring to FIG. 9, first, a main signal or the like is transmitted from the CPU 3 to the memories 13 on the interposer boards 11 through the connectors 12. Then, power (power supply voltage, ground voltage) is supplied to the memories 13 on the interposer boards 11 through the feeding members 23 (feeding bus bars 231, feeding bus bars 232) of the feeding/cooling mechanism 2. Note that auxiliary power may be supplied through the connectors 12.

As described above, the stacked memory module 1 according to the present embodiment includes the feeding/cooling mechanism 2 including the cooling plates 21 and feeding members 23. The feeding/cooling mechanism 2 is able to cool the memories 13 using the cooling plates 21 and to feed the interposer boards 11 using the feeding members 23. Thus, the stacked memory module 1 is able to transmit a main signal to the memories 13 on the interposer boards 11 through the connectors 12, as well as to feed (supply a power supply voltage, ground voltage to) the memories 13 through the feeding members 23 of the feeding/cooling mechanism 2. In other words, the stacked memory module 1 thus configured is able to independently use the signal transmission channels to the memories 13 and the power supply channels to the memories 13. Thus, for example, the stacked memory module 1 is able to supply a sufficient amount of power supply voltage at a shorter distance and thus to address a voltage drop. Also, the stacked memory module 1 is able to independently use the signal transmission channels to the memories 13 and the power supply channels to the memories 13 and thus the connectors 12 can be downsized. By downsizing the connectors 12, the stacked memory module 1 can be mounted in a smaller area. Thus, more stacked memory modules 1 can be mounted around the CPU 3.

While the case in which the memories 13 are mounted on the interposer board 11 has been described in the present embodiment, members other than the memories 13 may be mounted on the interposer boards 11. For example, semiconductor devices (chips) such as LSI (large-scale integration) may be mounted on the interposer boards 11.

In the present embodiment, as shown in FIGS. 2 and 7, the feeding/cooling mechanism 2 is mounted on the stacked memory modules from the sides opposite to the sides having the connectors 12 disposed thereon, of the approximately rectangular interposer boards 11. However, the feeding/cooling mechanism 2 may be mounted on the stacked memory modules from locations other than those described in the present embodiment. For example, the feeding/cooling mechanism 2 may be mounted on the stacked memory modules from long sides of the approximately rectangular interposer boards 11.

Second Embodiment

Next, a second embodiment of the present invention will be described with reference to FIGS. 10 and 11. First, referring to FIG. 10, the configuration of a stacked module 5 will be outlined.

Figure 10:
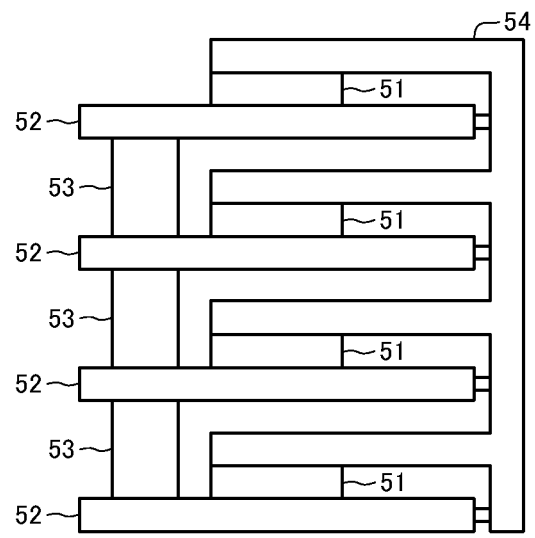
FIG. 10 is a drawing showing an example of the configuration of a stacked module according to a second embodiment of the present invention.

Referring to FIG. 10, the stacked module 5 includes components 51, multiple boards 52, connection components 53, and a feeding/cooling mechanism 54.

As shown in FIG. 10, in the stacked module 5, the boards 52 are stacked, and each board 52 has a component 51 mounted thereon.

The connection components 53 are connectors or the like and electrically connect the stacked boards 52.

The feeding/cooling mechanism 54 is in contact with and feeds the stacked boards 52. The feeding/cooling mechanism 54 are also in contact with and cools the components 51 mounted on the boards 52.

As seen above, the stacked module 5 includes the connection components 53 that electrically connect the boards 52 and the feeding/cooling mechanism 54 that feeds the boards 52 and cools the components 51 mounted on the boards 52. The stacked module 5 thus configured is able to transmit a signal or the like to the components 51 mounted on the boards 52 through the connection components 53 and to feed the components 51 through the feeding/cooling mechanism 54. Thus, the stacked module 5 is able to suppress a voltage drop without upsizing it.

A stacking method used to produce the stacked module 5 includes electrically connecting the stacked boards 52 having the components 51 mounted thereon, using the connection components 53 and inserting the feeding/cooling mechanism 54 between the stacked boards 52, the feeding/cooling mechanism 54 being configured to feed the boards 52 and to cool the components 51 mounted on the boards 52.

A stacked module mounting board having the above stacked module 5 mounted thereon includes the stacked module 5 and an arithmetic device that performs a predetermined process. The stacked module 5 includes the boards 52 having the components 51 mounted thereon, the connection components 53 that electrically connect adjacent boards of the stacked boards 52, and the feeding/cooling mechanism 54 that feeds the boards 52 and cools the components 51 mounted on the boards 52

The stacking method and stacked module mounting board thus configured also produce advantageous effects similar to those of the stacked module 5 and therefore are able to achieve the object of the present invention.

Examples of configurations capable of achieving the object of the present invention, as with the stacked module 5, include a feeding/cooling mechanism 6. Next, referring to FIG. 11, an example of the configuration of the feeding/cooling mechanism 6 will be described.

Figure 11:
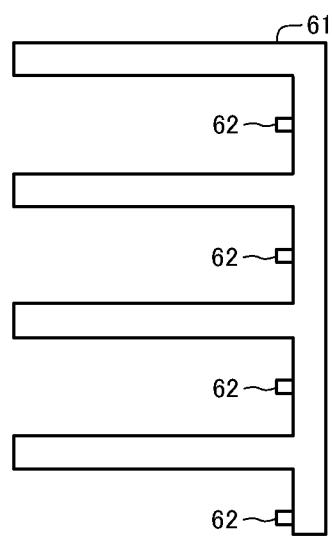
FIG. 11 is a drawing showing an example of the configuration of a feeding/cooling mechanism according to the second embodiment of the present invention.

Referring to FIG. 11, the feeding/cooling mechanism 6 includes a cooling member 61 and feeding members 62.

The cooling member 61 is inserted between stacked, electrically connected multiple boards and are in contact with and cools components mounted on the boards. The feeding members 62 are in contact with and feed the boards.

As seen above, the feeding/cooling mechanism 6 includes the cooling member 61 that is in contact with and cools the components mounted on the boards and the feeding members 62 that are in contact with and feed the boards. The feeding/cooling mechanism 6 thus configured is also able to achieve the object of the present invention, as with the stacked module 5.

SUPPLEMENTARY NOTES

Some or all of the above embodiments can be described as in Supplementary Notes below. A stacked module and the like according to the present invention will be outlined below. However, the present invention is not limited to the configurations below.

Supplementary Note 1

A stacked module comprising:
a plurality of stacked boards having components mounted thereon;
a connection component electrically connecting the stacked boards; and
a feeding/cooling mechanism configured to feed the boards and to cool the components mounted on the boards.

Supplementary Note 2

The stacked module according to Supplementary Note 1, wherein the feeding/cooling mechanism comprises:
a cooling member that is in contact with and cools the components mounted on the boards; and
a feeding member that is in contact with and feeds the boards.

Supplementary Note 3

The stacked module according to Supplementary Note 2, wherein the feeding member comprises sandwiching members that are disposed in positions corresponding to the stacked boards so that the boards are sandwiched between the sandwiching members, and the feeding member feeds the boards through the sandwiching members between which the boards are sandwiched.

Supplementary Note 4

The stacked module according to Supplementary Note 2 or 3, wherein the feeding member supplies a power supply voltage and a ground voltage to the boards in contact with the feeding member.

Supplementary Note 5

The stacked module according to any one of Supplementary Notes 2 to 4, wherein the boards are double-sided mounting boards having the components mounted on one side and another side thereof, and the cooling member comprises a cooling plate that is inserted between the stacked boards and that is in contact with and cools the components opposed to the cooling member.

Supplementary Note 6

The stacked module according to any one of Supplementary Notes 1 to 5, wherein
the connection member is a connector disposed on edges of the boards, and at least a signal including a main signal transmitted from outside is transmitted through the connector, and
the feeding/cooling mechanism feeds the boards.

Supplementary Note 7

The stacked module according to any one of Supplementary Notes 1 to 6, wherein
the connection component electrically connects the boards at edges of the boards, and
the feeding/cooling mechanism feeds the boards and cools the components mounted on the boards from sides opposite to sides having the connection component disposed thereon, of the boards.

Supplementary Note 8

A stacking method comprising:
electrically connecting a plurality of stacked boards having components mounted thereon, using a connection component; and inserting a feeding/cooling mechanism between the stacked boards, the feeding/cooling mechanism being configured to feed the boards and to cool the components mounted on the boards.

Supplementary Note 9

The stacking method according to Supplementary Note 8, wherein
the feeding/cooling mechanism comprises:
a cooling member is in contact with and cools the components mounted on the boards; and
a feeding member that is in contact with and feeds the boards, and
the feeding/cooling mechanism is inserted between the boards by sandwiching the boards between sandwiching members included in the feeding/cooling mechanism.

Supplementary Note 10

A cooling/feeding mechanism comprising:
a cooling member that is inserted between a plurality of stacked, electrically connected boards and is in contact with and cools components mounted on the boards; and
a feeding member that is in contact with and feeds the boards.

Supplementary Note 11

The cooling/feeding mechanism according to Supplementary Note 10, wherein
the feeding member comprises sandwiching members that are disposed in positions corresponding to the stacked boards so that the boards are sandwiched between the sandwiching members, and the feeding member feeds the boards through the sandwiching members between which the boards are sandwiched.

Supplementary Note 12

The cooling/feeding mechanism according to Supplementary Note 10 or 11, wherein the feeding member supplies a power supply voltage and a ground voltage to the boards in contact with the feeding member.

Supplementary Note 13

The cooling/feeding mechanism according to any one of (Supplementary Notes 10 to 12, wherein the cooling member comprises a cooling plate that is inserted between the stacked boards and that is in contact with and cools the components opposed to the cooling member.

Supplementary Note 14

The cooling/feeding mechanism according to any one of (Supplementary Notes 10 to 13, wherein
the cooling/feeding mechanism feeds the boards and cools the components mounted on the boards from sides opposite to sides having a connection component disposed thereon, of the boards, the connection component electrically connecting the stacked boards.

Supplementary Note 15

A stacked module mounting board comprising:
a stacked module comprising:
a plurality of stacked boards having components mounted thereon;
a connection component electrically connecting adjacent boards of the stacked boards; and
a feeding/cooling mechanism configured to feed the boards and to cool the components mounted on the boards; and
an arithmetic device configured to perform a predetermined process.

Supplementary Note 16

The stacked module mounting board according to Supplementary Note 15, wherein the feeding/cooling mechanism comprises:
a cooling member that is in contact with and cools the components mounted on the boards; and
a feeding member that is in contact with and feeds the boards.

Supplementary Note 17

The stacked module mounting board according to Supplementary Note 16, wherein
the feeding member comprises sandwiching members that are disposed in positions corresponding to the stacked boards so that the boards are sandwiched between the sandwiching members, and the feeding member feeds the boards through the sandwiching members between which the boards are sandwiched.

Supplementary Note 18

The stacked module mounting board according to Supplementary Note 16 or 17, wherein the feeding member supplies a power supply voltage and a ground voltage to the boards in contact with the feeding member.

Supplementary Note 19

The stacked module mounting board according to any one of Supplementary Notes 16 to 18, wherein
the boards are double-sided mounting boards having the components mounted on one side and another side thereof, and
the cooling member comprises a cooling plate that is inserted between the stacked boards and that is in contact with and cools the components opposed to the cooling member.

Supplementary Note 20

The stacked module mounting board according to any one of Supplementary Notes 15 to 19, wherein
the connection member is a connector disposed on edges of the boards, and at least a signal including a main signal transmitted from outside is transmitted through the connector, and
the feeding/cooling mechanism feeds the boards.

Supplementary Note 21

The stacked module mounting board according to any one of Supplementary Notes 15 to 20, wherein the connection component electrically connects the boards at edges of the boards, and the feeding/cooling mechanism feeds the boards and cools the components mounted on the boards from sides opposite to sides having the connection component disposed thereon, of the boards.

While the present invention has been described with reference to the embodiments, the present invention is not limited thereto. Various changes understandable by those skilled in the art can be made to the configuration or details of the invention of the present application without departing from the scope of the invention.

DESCRIPTION OF REFERENCE NUMERALS 1 stacked memory module
11 interposer board
12 connector
13 memory
131 bump
2 feeding/cooling mechanism
21 cooling plate
22 cooling support
23 feeding member
231, 232 feeding bus bar
2311, 2321 sandwiching member
3 CPU
4 board
41 connector
5 stacked module
51 component
52 board
53 connection component
54 feeding/cooling mechanism
6 feeding/cooling mechanism
61 cooling member
62 feeding member

The invention claimed is:

1. A stacked module comprising:
a plurality of stacked boards having components mounted thereon;
a connector, which is a connection component electrically connecting the stacked boards and configured to transmit a signal; and
a feeding/cooling mechanism configured to feed the stacked boards and to cool the components mounted on the stacked boards, wherein:
the feeding/cooling mechanism includes a cooling member that is in contact with and configured to cool the components mounted on the stacked boards and a feeding member that is in contact with and feeds the stacked boards;
the feeding member includes sandwiching members that are disposed in positions corresponding to the stacked boards so as to sandwich the stacked boards by spring mechanisms;
the feeding member sandwiches the stacked boards by the sandwiching members and feeds the sandwiched stacked boards;
the stacked boards are rectangular in shape, and
the connector that is the connection component is disposed on an end portion of one short side of the stacked boards, and the feeding/cooling mechanism is disposed on an end portion of another short side of the stacked boards.

2. The stacked module according to claim 1, wherein
the feeding member feeds the stacked boards through the sandwiching members between which the stacked boards are sandwiched.

3. The stacked module according to claim 1, wherein the feeding member supplies a power supply voltage and a ground voltage to the stacked boards in contact with the feeding member.

4. The stacked module according to claim 1, wherein
the stacked boards are double-sided mounting boards having the components mounted on one side and another side thereof, and
the cooling member comprises a cooling plate that is inserted between the stacked boards and that is in contact with and cools the components opposed to the cooling member.

5. The stacked module according to claim 1, wherein
the connector that is the connection component disposed on edges of the stacked boards, and at least a signal including a main signal transmitted from outside is transmitted through the connector that is the connection component.

6. The stacked module according to claim 1, wherein
the connector that is the connection component electrically connects the stacked boards at edges of the stacked boards, and
the feeding/cooling mechanism feeds the stacked boards and cools the components mounted on the stacked boards from sides opposite to sides having the connector that is the connection component disposed thereon, of the stacked boards.

7. A stacking method comprising:
electrically connecting a plurality of stacked boards having components mounted thereon, using a connection component such that the connection component is configured to transmit a signal; and
inserting a feeding/cooling mechanism between the stacked boards, the feeding/cooling mechanism being configured to feed the stacked boards and to cool the components mounted on the stacked boards, wherein
the feeding/cooling mechanism includes a cooling member that is in contact with and configured to cool the components mounted on the stacked boards and a feeding member that is in contact with and feeds the stacked boards;
the feeding member includes sandwiching members that are disposed in positions corresponding to the stacked boards so as to sandwich the stacked boards by spring mechanisms;
the feeding member sandwiches the stacked boards by the sandwiching members and feeds the sandwiched stacked boards;
the stacked boards are rectangular in shape, and
the connector that is the connection component is disposed on an end portion of one short side of the stacked boards, and the feeding/cooling mechanism is disposed on an end portion of another short side of the stacked boards.

8. A cooling/feeding mechanism comprising:
a cooling member that is inserted between a plurality of stacked, electrically connected boards and is in contact with and cools components mounted on the boards; and
a feeding member that is in contact with and feeds the stacked boards, wherein
the feeding member includes sandwiching members that are disposed in positions corresponding to the stacked boards so as to sandwich the stacked boards by spring mechanisms;

the feeding member sandwiches the stacked boards by the sandwiching members and feeds the sandwiched stacked boards;
the stacked boards are rectangular in shape,
the stacked boards are electrically connected by way of a connector which is a connection component electrically connecting the stacked boards and configured to transmit a signal, and
the connector that is the connection component is disposed on an end portion of one short side of the stacked boards, and the feeding/cooling mechanism is disposed on an end portion of another short side of the stacked boards.

9. The cooling/feeding mechanism according to claim 8, wherein
the feeding member feeds the stacked boards through the sandwiching members between which the stacked boards are sandwiched.

10. The cooling/feeding mechanism according to claim 8, wherein the feeding member supplies a power supply voltage and a ground voltage to the stacked boards in contact with the feeding member.

11. The cooling/feeding mechanism according to claim 8, wherein the cooling member comprises a cooling plate that is inserted between the stacked boards and that is in contact with and cools the components opposed to the cooling member.

12. The cooling/feeding mechanism according to claim 8, wherein
the cooling/feeding mechanism feeds the stacked boards and cools the components mounted on the stacked boards from sides opposite to sides having the connector that is the connection component disposed thereon, of the stacked boards.

* * * * *